March 5, 1957 F. WOHLMAN 2,784,296

PULSING APPARATUS FOR SEMICONDUCTOR TRANSLATING DEVICES

Filed May 2, 1955 2 Sheets-Sheet 1

INVENTOR.
FRED WOHLMAN
BY
Henry Heyman
ATTORNEY

INVENTOR.
FRED WOHLMAN
BY
Henry Heyman
ATTORNEY 2,784,296

PULSING APPARATUS FOR SEMICONDUCTOR TRANSLATING DEVICES

Fred Wohlman, Inglewood, Calif., assignor to Hughes Aircraft Company, Culver City, Calif., a corporation of Delaware Application May 2, 1955, Serial No. 505,277

8 Claims. (Cl. 219—78)

This invention relates generally to a device for automatically applying a pulsing current to electrodes of semiconductor translating devices, whereby to induce a welded junction between primary and base electrodes. More specifically, this invention relates to a manually fed, automatically controlled and operable machine that is adapted for reception, transportation and delivery of semiconductor translating devices, with means being provided for applying a controlled electrical pulsing current thereto over a predetermined period of time.

In the manufacture of semiconductor translating devices, in order that the end result and functional characteristics of the devices may be maintained at a high value commensurate with necessities of mass production techniques, one important necessity in such manufacture of these semiconductor translating devices such as, for example, transistors of various types, diodes or rectifiers, photocell devices and the like, is that a junction must be provided between the whisker or primary electrode and a semiconductor body or crystal that is generally attached to or mounted on a base electrode. This junction is usually established by application of a controlled quantity of electrical current across the two electrodes, whereby to weld a previously free end of the whisker to one surface of the crystal or other semiconductor body. Not only must this welding or pulsing current be of a predetermined and controlled value, but additionally, the interval of application to the translating device electrodes must also be accurately controlled with these factors cooperating to provide the necessary and desired junction.

With reference again to the necessity for integration of semiconductor translating device manufacturing machinery with other mass production techniques, due to the relatively small sizes and delicate nature of such devices, it is important that mechanism be provided in such pulsing machinery enabling rapid feeding, acceptance, transportation and delivery of the translating devices in a manner not only to provide high yield, but also to prevent any undue shock, strain, vibration or other detrimental conditions during the handling of the translating devices. Such conditions must furthermore be considered in connection with the necessity for automatically establishing an electrical connection between the leads of semiconductor translating devices and a source of controlled electrical current.

It is accordingly one important object of the present invention to provide a pulsing or welding apparatus for semiconductor translating devices.

It is another important object of the present invention to provide a pulsing device for semiconductor translating devices that is simple in construction, efficient in operation, reliable and effective in use and capable of integration with other mass production techniques.

A further important object of the present invention is to provide a pulsing apparatus for semiconductor translating devices that is operable by unskilled operators in a manner to apply a welding or pulsing controlled quantity of electrical current to electrodes or leads of the devices over a predetermined time interval.

Still another important object of the present invention is to provide a pulsing apparatus for semiconductor translating devices including means for receiving, transporting and handling such devices in a smooth, gentle and rapid manner commensurate with desired handling characteristics necessary in connection with the delicate and frangible nature of the devices.

Other and further important objects of the present invention will become apparent from the disclosures in the following detailed specification, appended claims and accompanying drawings, wherein:

Figure 1:
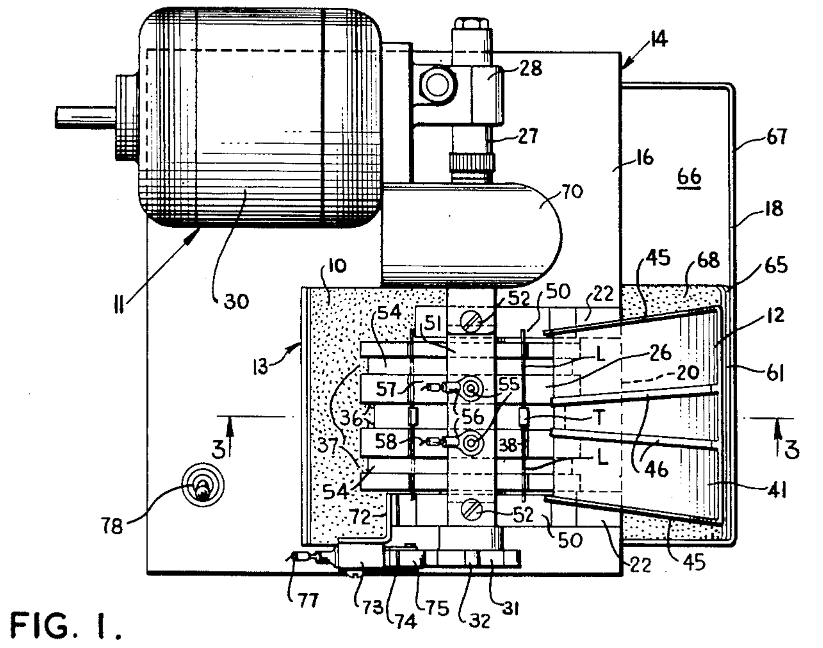
Figure 1 is a top plan view of the present pulsing apparatus for semiconductor translating devices.

With reference to the drawings, the pulsing apparatus of the present invention includes generally a semiconductor translating device transporting structure 10, a driving mechanism 11 for the transporting structure, a guiding device 12 for the delivery of semiconductor translating devices to the transporting structure 10 and a chute 13 for receiving the translating devices from the transporting structure and delivering such devices to a point of access. All of the structures described hereinbefore are adapted to rest upon a suitable base arrangement indicated generally at 14.

The base arrangement 14 includes an inverted U-shaped base member 15 having a horizontally disposed top portion 16 and vertically disposed side portions 17. A tray 18 is disposed between and spaced from the side portions 17, and is secured thereto by any suitable means and adapted for a purpose to be hereinafter more fully described.

Figure 2:
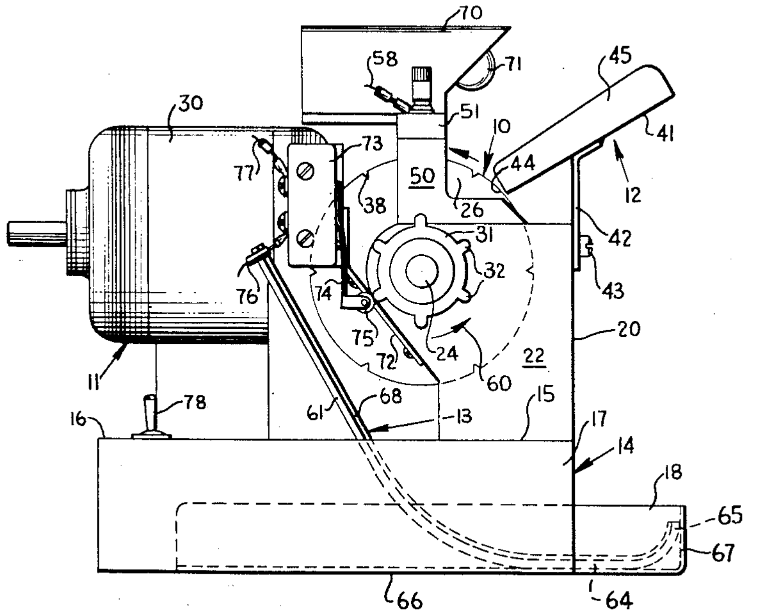
Fig. 2 is a side elevational view thereof.
Figure 3:
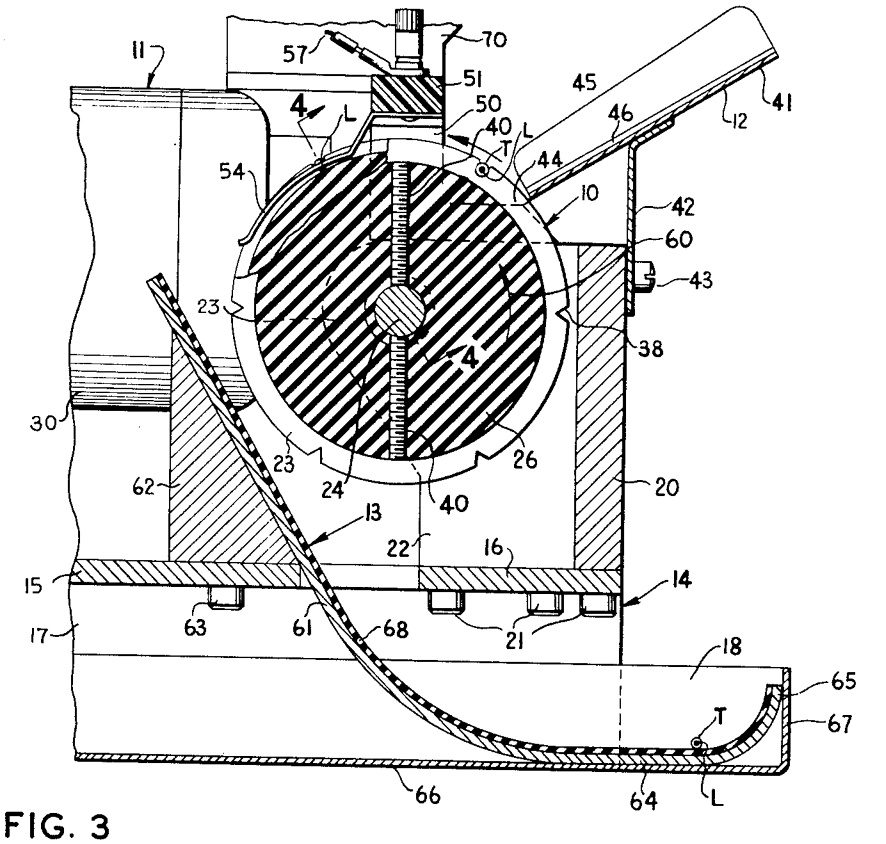
Fig. 3 is an enlarged fragmentary sectional view through the operating mechanisms of the present apparatus, as taken substantially as indicated by line 3—3, Fig. 1.

As shown primarily in Figs. 2 and 3, a bearing support structure 20 is disposed on the horizontal portion 16 of the base 17 and secured thereto by means of screws 21, or the like. The support structure 20 has side portions 22 disposed in parallel relationship, the side portions 22 serving to support sleeve bearings 23 in which a transversely disposed shaft 24 is rotatably journalled. The transporting structure 10 is adapted to be mounted on the shaft 24, there being washers 25 disposed between sides of a rotor 26 of the transporting structure and inwardly directed opposed surfaces of the side portions 22. One end of the shaft 24 is connected by means of a disconnectable extension 27, Fig. 1, to a transmission arrangement 28 which is, in turn, operably driven by means of an electric motor 30, forming a portion of the driving mechanism 11. The other end of the shaft 24 is fitted with a cam 31 having a plurality of lobes 32, the cam 31 being retained in position on the one end of the shaft 24 by means of a suitable set screw 33.

Figure 4:
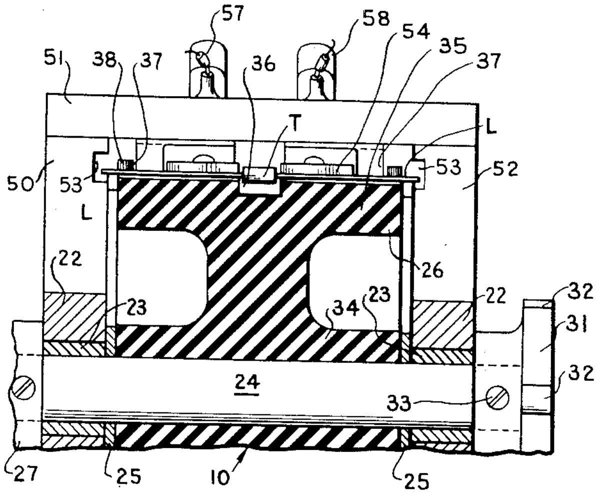
Fig. 4 is a further enlarged fragmentary sectional view showing a portion of the transporting structure of the present apparatus, as taken substantially as indicated by line 4—4, Fig. 3.

With reference primarily to Figs. 1, 3 and 4, the rotor 26 of the transporting structure 10 includes a hub portion 34, that is disposed about the shaft 24, and having a peripheral flanged portion 35. The central axial area of the periphery of the rotor 26 is provided with a primary annular groove 36 that is generally rectangular in cross-section. The rotor 26 is further provided, adjacent the axial ends thereof, with a pair of secondary annular grooves 37 that are also generally rectangular in cross-section. It is to be noted that the annular groove 36 has a radial depth substantially greater than the radial depth of the groove 37. The rotor 26 is still further provided with a plurality of parallel, spaced, V-shaped, generally axially extending grooves or notches 38 in the periphery thereof, with the depth of the grooves 38 being substantially equal to the depth of the secondary annular grooves 37. Additionally, the rotor 26 is maintained in fixed relationship on the shaft 24 by means of a pair of set screws 40.

As shown primarily in Figs. 1 and 3, the semiconductor translating device guiding structure 12 includes an angularly disposed guiding member 41 that is secured in position by means of a bracket 42 that is, in turn, attached to the bearing support member 20 by means of a screw 43. A lower end 44, of the member 41, is disposed in close approximation to the outer periphery of the rotor 26, the member 41 being provided with generally inwardly directed converging side guide portions 45 and a pair of converging ways 46. The lower ends of the side portions 45 extend in close approximation to, and slightly beyond the outer axial ends of the outer periphery of the rotor 26, while the lower ends of the ways 46 are in coextensive radial alignment with the primary groove 36 in the rotor 26.

Thus, semiconductor translating devices, indicated generally at T and having laterally extending leads L, may be manually placed upon the guide member 41 with the bodies thereof being confined between the ways 46. The translating devices will then gravitate to a position whereby to rest upon the outer periphery of the rotor 26 until such time as one of the transverse notches 38 comes into alignment with the lower end 44 of the guide member 41, whereupon the translating device lowermost on the guide member 41 will be picked up by the aligned notches 38. With reference to Fig. 4, the body T of the translating device is adapted to rest within the confines of the primary groove 36, while the leads L extend across the secondary grooves 37 and slightly beyond the axial ends of the rotor 26. It is to be noted that the spacing between the lower end 44 of the guide member 41 and the outer periphery of the rotor 26 is such, coupled with the radial depth of the transverse notches 38, that, in spite of there being several translating devices on the guide member 41, only a single translating device will be disposed in each of the transverse notches 38.

In order that the leads L of the semiconductor translating devices may be momentarily connected to a source of controlled electrical current, upper surfaces of the side portions 22 of the bearing support member 20 support one each of a pair of brackets 50. A transversely disposed bar 51, of insulating material, is disposed between the brackets 50, there being bolts 52 extending through opposite ends of the member 51 whereby, not only to secure the member 51 to the brackets 50, but also to secure the brackets 50 to the side portions 22 of the bearing supporting member 20. In order that the ends of the leads L of the semiconductor translating devices may be prevented from interfering with the brackets 50, each of the brackets 50 is provided with an inwardly directed slot 53, that is disposed adjacent the outer periphery of the rotor 26. This particular construction may be seen in detail in Fig. 4.

The transverse member 51 has attached to the lower surface thereof, a pair of leaf spring contact brushes 54 that are secured in position by means of screws 55, the upper ends of the screws 55 having mounted thereon a pair of electrical connecting members 56 that are connected respectively to leads 57 and 58. The free ends of the brushes 54 are adapted for disposition in the secondary grooves 37 and extend along a substantial distance therein. Thus, as the rotor 26 is moved in the direction of the arrow 60, Fig. 3, the semiconductor translating devices, carried by the transverse notches 38, will have the leads L thereof moved into brushing contact with the brushes 54 for a purpose to be hereinafter more fully described.

When the leads L of the semiconductor translating devices move to a position out of contact with the brushes 54, such devices are free to drop from the notches 38 and onto the chute 13. The chute 13 includes generally a downwardly inclined backing member 61 that is mounted on an angular block 62 which is, in turn, secured to the horizontal portion 16 of the base structure 14 by means of suitable screws 63. The backing member 61 extends diagonally downwardly and is curved into a horizontal position as at 64 and is further curved upwardly as at 65. The portion 64 is adapted to rest in contact with a bottom 66 of the tray 18, while upwardly turned portion 65 is disposed in contact with a front portion 67 of the tray 18. With reference to Fig. 3, it is to be noted that the backing member 61 may be provided with a resilient covering 68, in order to provide a smooth resilient surface along which the pulsed translating devices may travel to a position of access within the forward portion of the chute 13 and tray 18.

As shown in Figs. 1 and 2, one of the bolts 52 also serves to support a lamp housing 70 in which a bulb 71 is mounted. As will be described hereinafter, the bulb 71 serves to provide a visual indication of the application of a welding pulse to the semiconductor translating device.

The side portion 22, opposite from the side portion 22 utilized to support the lamp housing 70, serves to support a bracket 72 on which is mounted a switch 73. The switch 73 has an operating arm 74, one end of which is adapted to carry a roller 75. The roller 75 is disposed in cooperative relationship with the lobes 32 of the cam 31, whereby to close the switch 73 at periodic intervals. The switch 73 has a pair of leads 76 and 77 connected thereto. For operation of the present apparatus, a master switch 78 is mounted on the transverse portion 16 of the base 14 at a position toward the rearward portion of this base structure.

Figure 5:
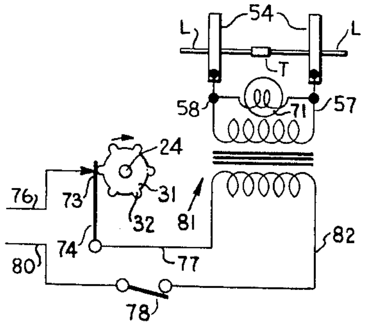
Fig. 5 is a schematic wiring diagram showing a typical means whereby to apply a controlled quantity of electrical current to the electrodes of semiconductor translating devices.

As shown primarily in Fig. 5, a pulsing or welding current may be applied to the leads L of the semiconductor translating devices as by any suitable means, with the circuit shown being merely by way of example with the exception of the particular details thereof associated with mechanical elements of the present apparatus. As shown in the schematic diagram, electrical energy is delivered through lead 76 and a lead 80, the lead 76 extending to the switch 73 and the lead 80 extending to the master switch 78. The lead 77, from the master switch 73, extends to the primary winding of a transformer 81, this winding of the transformer also being connected, by way of a lead 82, to the other side of the master switch 78. The secondary winding of the transformer 81 is connected, by way of the leads 57 and 58, to the spring contact brushes 54, the indicating lamp 71 being connected across the leads 57 and 58. It is to be noted that the relatively narrow lobes of the cam 32 serve momentarily to close the switch 73 upon rotation of the cam, with such closure of the switch 73 being timed to coincide with the disposition of the leads L of a semiconductor translating device in position in transverse notches 38 and in contact with the brushes 54. In other words, during the travel of the leads L of the semiconductor translating device in contact with the brushes 54, a controlled quantity of electrical current is applied across the leads, by means of the brushes 54, whereby to induce the welding of the whisker or primary electrode to the semiconductor body or secondary electrode formed within the envelope of the semiconductor translating device being pulsed. It is to be noted that the peripheral length of the brushes 54 is slightly less than the peripheral distances between the transverse notches 38, in order to prevent interference between the brushes and unpulsed semiconductor translating devices. Additionally, this action prevents application of more than one welding pulse to the leads of the individual semiconductor translating devices. Upon disposition of the translating devices on the chute 13, such devices will move to the position as shown in Fig. 3 so as to be readily accessible to an operator for removal from the apparatus. It is to be noted that the time interval for application of the controlled electrical current is determined by closure of the switch 73 by action of the lobes 32 of the cam 31. It is to be noted that this welding or pulsing time interval is determined by the circumferential width of the lobes 32 and that pulsing of the translating device occurs when there is only a single translating device beneath the inwardly directed surface of the brushes 54. Furthermore, the bulb 71 will be energized as a pulse is applied to the translating device, thereby providing a visual indication of the application of such pulse.

It may thus be seen that an operator may successively place a plurality of semiconductor translating devices on the upper surface of the guide member 41, and that these devices will be successively picked up and transported by the transport structure 10, will have a welding pulse applied thereto and will be deposited on the chute 13 for delivery therealong to the forward portion of the chute within the outwardly extending portion of the tray 18. From this last position, the pulsed translating devices may manually be collected and delivered to a point of sorting and/or use thereof. While the rotor 26 is driven at a relatively slow speed, as compared with the speed of the electric motor 30 and through the transmission 28, the speed of the rotor may be relatively fast but limited by the length of the desired pulse applied to the leads L.

Having thus described the invention and the present embodiment thereof, it is desired to emphasize the fact that many modifications may be resorted to in a manner limited only by a just interpretation of the following claims.

I claim:

1. A pulsing apparatus for semiconductor translating devices comprising, in combination: a frame including a base; a cylindrical device transporting rotor mounted for rotation on said frame; means for continuously driving said rotor; groove and notch means formed in a periphery of said rotor for receiving and supporting said semiconductor translating devices; a guiding member mounted on said frame in close approximation to said periphery of said rotor for receiving and directing said devices toward said groove and notch means; brush means for providing electrical connection with leads of said devices and with an electrical circuit including a source of controlled electrical current; means operably associated and driven in conjunction with said rotor for momentarily energizing said circuit; and chute means for gravitationally receiving pulsed devices from said groove and notch means and delivering said devices to a point of access by an operator of said apparatus.

2. A pulsing apparatus for semiconductor translating devices comprising, in combination: a frame including a base; a cylindrical device transporting rotor mounted for rotation on said frame; means for continuously driving said rotor; groove and notch means formed in a periphery of said rotor for receiving and supporting said semiconductor translating devices; a guiding member mounted on said frame in close approximation to said periphery of said rotor for receiving and directing said devices toward said groove and notch means; brush means cooperable with a portion of said groove and notch means for providing electrical connection with leads of said devices and with an electrical circuit including a source of controlled electrical current; means operably associated and driven in conjunction with said rotor for momentarily energizing said circuit; and chute means for gravitationally receiving pulsed devices from said groove and notch means and delivering said devices to a point of access by an operator of said apparatus.

3. A pulsing apparatus for semiconductor translating devices comprising, in combination: a frame including a base; a cylindrical device transporting rotor mounted for rotation on said frame; means for continuously driving said rotor; annular groove and transverse notch means formed in a periphery of said rotor for receiving and supporting said semiconductor translating devices, said transverse notch means serving to maintain said devices in spaced relationship on said rotor; a guiding member mounted on said frame in close approximation to said periphery of said rotor for receiving and directing said devices toward said groove and notch means; brush means for providing electrical connection with leads of said devices and with an electrical circuit including a source of controlled electrical current; means operably associated and driven in conjunction with said rotor for momentarily energizing said circuit; and chute means for gravitationally receiving pulsed devices from said groove and notch means and delivering said devices to a point of access by an operator of said apparatus.

4. A pulsing apparatus for semiconductor translating devices comprising, in combination: a frame including a base; a cylindrical device transporting rotor mounted for rotation on said frame; means for continuously driving said rotor; annular groove and transverse notch means formed in a periphery of said rotor for receiving and supporting said semiconductor translating devices, said transverse notch means serving to maintain said devices in spaced relationship on said rotor; a guiding member mounted on said frame in close approximation to said periphery of said rotor for receiving and directing said devices toward said groove and notch means; brush means cooperable with a portion of said groove and notch means for providing electrical connection with leads of said devices and with an electrical circuit including a source of controlled electrical current; means operably associated and driven in conjunction with said rotor for momentarily energizing said circuit; and chute means for gravitationally receiving pulsed devices from said groove and notch means and delivering said devices to a point of access by an operator of said apparatus.

5. A pulsing apparatus for semiconductor translating devices comprising, in combination: a frame including a base; a cylindrical device transporting rotor mounted for rotation on said frame; means for continuously driving said rotor; annular groove and transverse notch means formed in a periphery of said rotor for receiving and supporting said semiconductor translating devices, said transverse notch means serving to maintain said devices in spaced relationship on said rotor; an angularly disposed guiding member mounted on said frame and having a lower end portion disposed in close approximation to said periphery of said rotor, said member being adapted for receiving and directing said devices toward said groove and notch means; brush contact means cooperable with a portion of said groove and notch means for providing electrical connection with leads of said devices and with an electrical circuit including a source of controlled electrical current; cam means operably associated and driven in conjunction with said rotor for momentarily energizing said circuit; and angularly disposed chute means for gravitationally receiving pulsed devices from said groove and notch means and delivering said devices to a point of access by an operator of said apparatus.

6. In a pulsing or welding apparatus for semiconductor translating devices, the combination of: a base; a supporting structure mounted on said base; a shaft journalled in said supporting structure; a cylindrical rotor mounted on said shaft; means for continuously driving said shaft and said rotor; a plurality of annular, transversely spaced grooves in a periphery of said rotor, at least one of said grooves being of a greater radial depth than the other of said grooves; a plurality of circumferentially spaced, transversely disposed, V-shaped notches also formed in said periphery of said rotor, said notches having a radial depth substantially equal to the radial depth of at least a portion of said annular grooves; an angularly disposed guiding member; bracket means for mounting said guiding member on said supporting structure, a lower end of said guiding member being disposed in close approximation to said periphery of said rotor, said guiding member being adapted for manual reception and direction of said devices toward said periphery of said rotor, for disposition thereof in said annular grooves and said notches; a pair of resilient contact brushes disposed circumferentially in a pair of said annular grooves, leads of said devices being adapted for contact with said brushes; a source of controlled electrical current; an electrical circuit for connecting said source with said brushes; switch means in said circuit for providing controlled energization thereof and delivery of said current to said leads of said devices; a cam mounted on said shaft, said switch being mounted on said supporting structure in cooperative relationship with said cam, whereby momentarily to close said switch in timed relationship with disposition of said devices in contact with said brushes; and a chute disposed on said base and spaced from said rotor, whereby gravitationally to receive pulsed devices from said rotor, said chute having inclined portions for delivering said devices to a point of access by an operator of said apparatus.

7. In a pulsing or welding apparatus for semiconductor translating devices, the combination of: a base; a supporting structure mounted on said base; a shaft journalled in bearings carried by said supporting structure; a cylindrical rotor mounted on said shaft; motor means for continuously driving said shaft and said rotor; three annular, transversely spaced grooves in a periphery of said rotor, the center one of said grooves being of a greater radial depth than the other of said grooves; a plurality of circumferentially spaced, transversely disposed, V-shaped notches also formed in said periphery of said rotor, said notches having a radial depth substantially equal to the radial depth of the outermost of said annular grooves; an angularly disposed guiding member; bracket means for mounting said guiding member on said supporting structure, a lower end of said guiding member being disposed in close approximation to said periphery of said rotor, said guiding member being adapted for manual reception and direction of said devices toward said periphery of said rotor, for disposition thereof in said annular grooves and said notches; a pair of resilient contact brushes disposed circumferentially in said outermost of said annular grooves, leads of said devices being adapted for contact with said brushes; a source of controlled electrical current; an electrical circuit for connecting said source with said brushes; switch means in said circuit for providing controlled energization thereof and delivery of said current to said leads of said devices; a multi-lobed cam mounted on said shaft, said switch being mounted on said supporting structure in cooperative relationship with said cam, whereby momentarily to close said switch in timed relationship with disposition of said devices in contact with said brushes; and a chute disposed on said base and spaced from said rotor, whereby gravitationally to receive pulsed devices from said rotor, said chute having inclined portions for delivering said devices to a point of access by an operator of said apparatus.

8. In a pulsing or welding apparatus for semiconductor translating devices, the combination of: a base; a supporting structure mounted on said base; a shaft journalled in bearings carried by said supporting structure; a cylindrical rotor mounted on said shaft; electric motor means for continuously driving said shaft and said rotor; three annular, transversely spaced grooves in a periphery of said rotor, at least one of said grooves being of a greater radial depth than the other of said grooves; a plurality of circumferentially spaced, transversely disposed, V-shaped notches also formed in said periphery of said rotor, said notches having a radial depth substantially equal to the radial depth of the outermost of said annular grooves; an angularly disposed guiding member; bracket means for mounting said guiding member on said supporting structure, a lower end of said guiding member being disposed in close approximation to said periphery of said rotor, said guiding member being adapted for manual reception and direction of said devices toward said periphery of said rotor, for disposition thereof in said annular grooves and said notches; a pair of resilient contact brushes disposed circumferentially in said outermost of said annular grooves, leads of said devices being adapted for contact with said brushes; a source of controlled electrical current; an electrical circuit for connecting said source with said brushes; switch means in said circuit for providing controlled energization thereof and delivery of said current to said leads of said devices; a multi-lobed cam mounted on said shaft, said switch being mounted on said supporting structure in cooperative relationship with said cam, whereby momentarily to close said switch in timed relationship with disposition of said devices in contact with said brushes; a chute disposed on said base and spaced from said rotor, whereby gravitationally to receive pulsed devices from said rotor, said chute having inclined portions for delivering said devices to a point of access by an operator of said apparatus; and lamp means providing a visual indication of application of the welding pulse to said devices.

References Cited in the file of this patent

UNITED STATES PATENTS 1,647,296 Jefferies ---------------- Nov. 1, 1927